US012584980B2

(12) United States Patent
Gao et al.

(10) Patent No.: US 12,584,980 B2
(45) Date of Patent: Mar. 24, 2026

(54) MAGNETIC RESONANCE SCANNING AND IMAGING METHOD AND MAGNETIC RESONANCE IMAGING SYSTEM

(71) Applicant: GE Precision Healthcare LLC, Waukesha, WI (US)

(72) Inventors: Lei Gao, Beijing (CN); Hanbei Zhang, Beijing (CN); Wei Chang, Beijing (CN); Huijing Zhou, Beijing (CN); Yongchuan Lai, Beijing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 180 days.

(21) Appl. No.: 18/737,408

(22) Filed: Jun. 7, 2024

(65) Prior Publication Data

US 2024/0410963 A1      Dec. 12, 2024

(30) Foreign Application Priority Data

Jun. 9, 2023      (CN) .......................... 202310685595.8

(51) Int. Cl.
*G01R 33/36* (2006.01)

(52) U.S. Cl.
CPC .................................... *G01R 33/36* (2013.01)

(58) Field of Classification Search
CPC .............................. G01R 33/288; G01R 33/36
See application file for complete search history.

(56) References Cited

U.S. PATENT DOCUMENTS

| | | | | |
|---|---|---|---|---|
| 11,079,449 B2 * | 8/2021 | Shen | .................... | G01R 33/543 |
| 11,789,103 B2 * | 10/2023 | Grodzki | ............. | G01R 33/5615 |
| | | | | 600/410 |
| 2016/0231396 A1 * | 8/2016 | Sunaga | ................ | G01R 33/288 |

OTHER PUBLICATIONS

Prost et al., "SAR reduced pulse sequences." Magn Reson Imaging. Mar.-Apr. 1988;6(2):125-30. doi: 10.1016/0730-725x(88)90441-9. PMID: 3374283, 6 pages.

* cited by examiner

*Primary Examiner* — Gregory H Curran

(57) ABSTRACT

Embodiments of the present application provide a magnetic resonance scanning and imaging method, and a magnetic resonance imaging system. The method includes: determining a pulse to be adjusted in a scan sequence, the pulse to be adjusted including a first radio-frequency pulse and a first gradient pulse applied along with the first radio-frequency pulse; determining an adjustment factor based on the first gradient pulse and a minimum repetition time related to a specific absorption rate of radio-frequency energy; adjusting the scan sequence based on the adjustment factor; and, using the adjusted scan sequence, performing a diagnostic scan on a site to be examined, to obtain a magnetic resonance image.

11 Claims, 8 Drawing Sheets

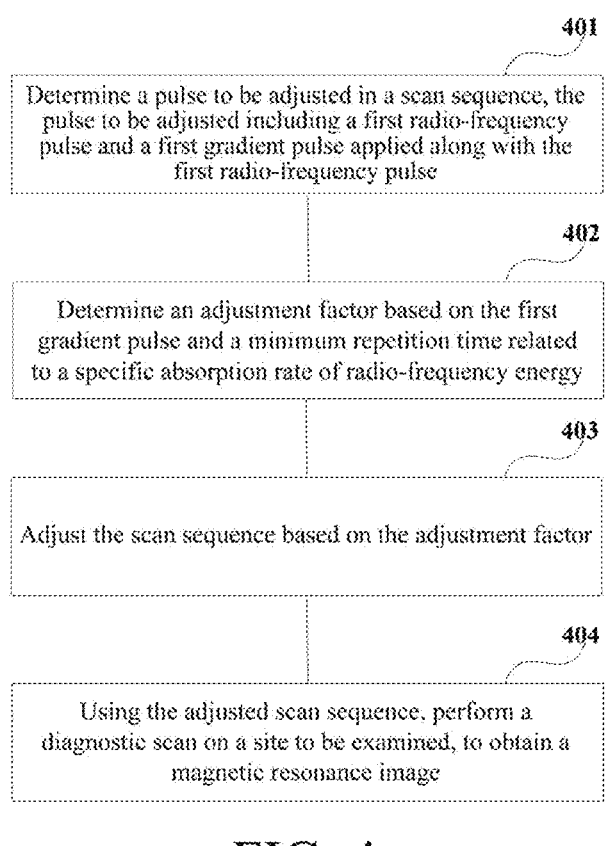

401

Determine a pulse to be adjusted in a scan sequence, the pulse to be adjusted including a first radio-frequency pulse and a first gradient pulse applied along with the first radio-frequency pulse

402

Determine an adjustment factor based on the first gradient pulse and a minimum repetition time related to a specific absorption rate of radio-frequency energy

403

Adjust the scan sequence based on the adjustment factor

404

Using the adjusted scan sequence, perform a diagnostic scan on a site to be examined, to obtain a magnetic resonance image

FIG. 4

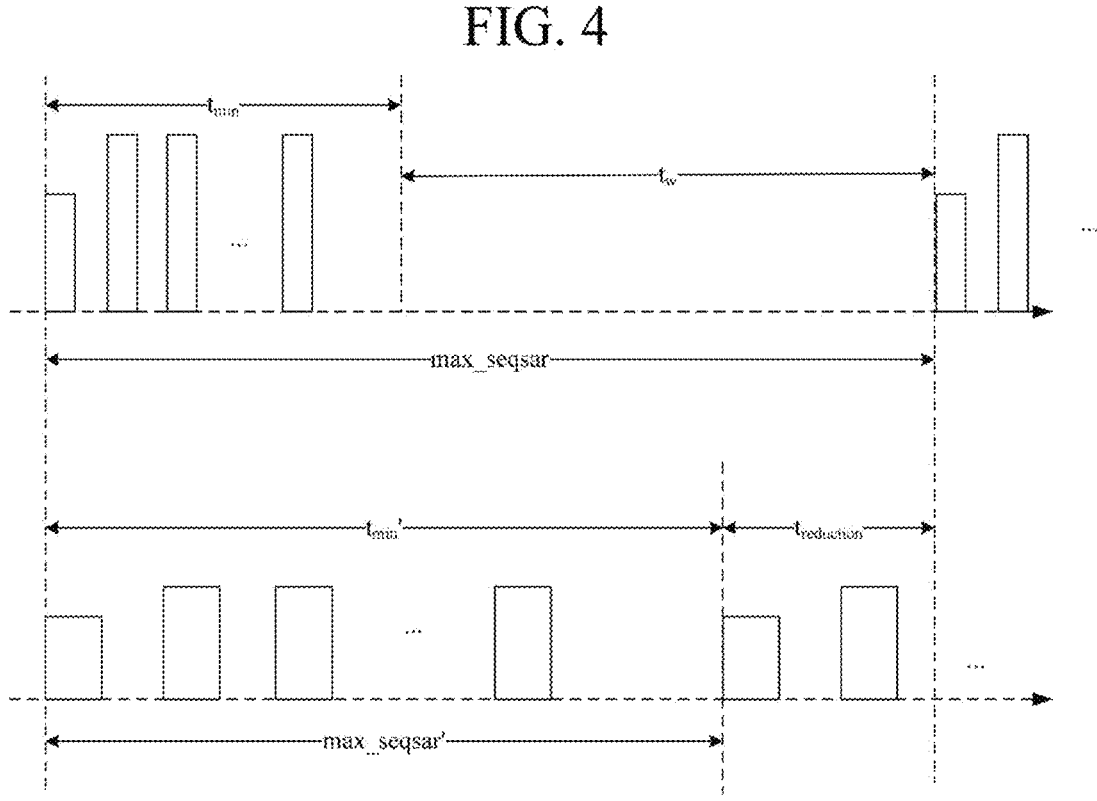

FIG. 5

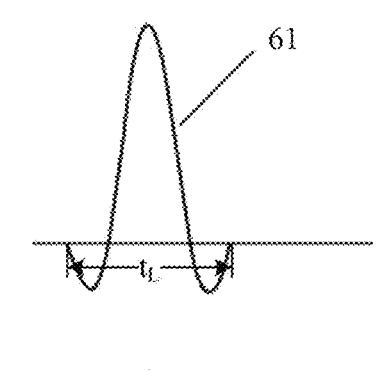
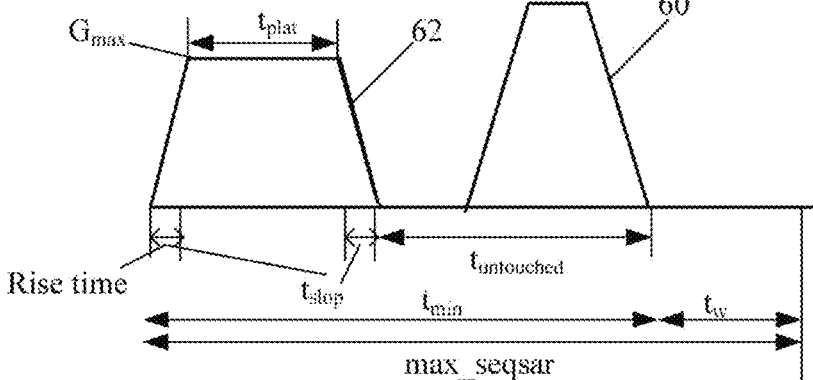
FIG. 6
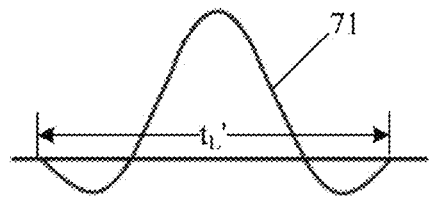
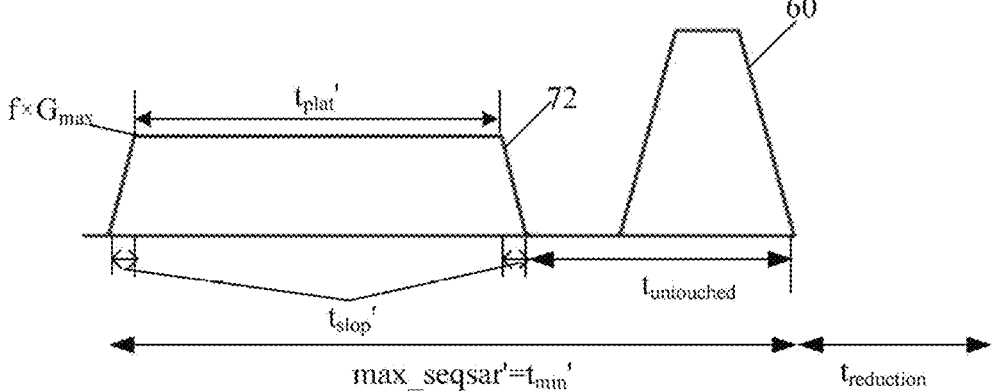
FIG. 7

MAGNETIC RESONANCE SCANNING AND IMAGING METHOD AND MAGNETIC RESONANCE IMAGING SYSTEM

CROSS REFERENCE TO RELATED APPLICATIONS

The present application claims priority and benefit of Chinese Patent Application No. 202310685595.8 filed on Jun. 9, 2023, which is incorporated herein by reference in its entirety.

TECHNICAL FIELD

Examples of the present application relate to the technical field of medical devices, and in particular to a magnetic resonance scanning and imaging method and a magnetic resonance imaging system.

BACKGROUND

Magnetic resonance (MR) imaging systems are widely used in the field of medical diagnostics. Magnetic resonance systems generally have a main magnet, a gradient amplifier, a radio-frequency (RF) amplifier, a gradient coil, a transmit chain module, a transmit/receive coil, a receive chain module, etc. The transmit chain module generates a pulse signal and transmits the pulse signal to the transmit/receive coil. The transmit/receive coil generates a radio-frequency excitation signal to excite a scan subject to generate a magnetic resonance signal. After the excitation has ended, by means of spatial encoding, the transmit/receive coil acquires the magnetic resonance signal, and the magnetic resonance signal is filled into k-space, thereby reconstructing a medical image.

When using a magnetic resonance imaging system to image a scan subject, a radio-frequency transmit coil is used to transmit a radio-frequency excitation pulse to a tissue to be imaged, and a large part of the power of the radio-frequency excitation pulse is absorbed by the scan subject and converted into thermal energy. If the tissue to be imaged absorbs excessive radio-frequency energy in a short time, local burns and even greater safety issues may be caused. The absorption rate (SAR) of radio-frequency energy is the amount of radio-frequency power absorbed per unit mass of tissue measured in watts per kilogram (W/kg), and may be used as an index for measuring MRI safety. Currently, some safety regulations and international standards specify in detail an upper limit value of the SAR during magnetic resonance scanning for each body part of each scan subject.

SUMMARY

The examples of the present application provide a magnetic resonance scanning and imaging method and a magnetic resonance imaging system.

According to an aspect of the examples of the present application, a magnetic resonance scanning and imaging method is provided, comprising: determining a pulse to be adjusted in a scan sequence, the pulse to be adjusted comprising a first radio-frequency pulse and a first gradient pulse applied along with the first radio-frequency pulse. The magnetic resonance scanning and imaging method also includes determining an adjustment factor based on the first gradient pulse and a minimum repetition time related to a specific absorption rate of radio-frequency energy. Further, the magnetic resonance scanning and imaging method also includes adjusting the scan sequence based on the adjustment factor; and using the adjusted scan sequence, performing a diagnostic scan on a site to be examined, to obtain a magnetic resonance image.

According to an aspect of the examples of the present application, a magnetic resonance imaging system is provided, comprising: a scanning unit; and a controller configured to: determine a pulse to be adjusted in a scan sequence, the pulse to be adjusted comprising a first radio-frequency pulse and a first gradient pulse applied along with the first radio-frequency pulse. The controller is also configured to determine an adjustment factor based on the first gradient pulse and a minimum repetition time related to a specific absorption rate of radio-frequency energy. The controller is further configured to adjust the scan sequence based on the adjustment factor; and make the scanning unit perform a diagnostic scan on a site to be examined using the adjusted scan sequence, to obtain a magnetic resonance image.

One of the beneficial effects of the examples of the present application is that: the adjustment factor is determined based on the first gradient pulse applied simultaneously with the first radio-frequency pulse and the minimum repetition time related to the specific absorption rate of radio-frequency energy, the scan sequence is adjusted based on the adjustment factor, and the diagnostic scan is performed on the site to be examined using the adjusted scan sequence. Therefore, scanning time can be minimized as much as possible in a low SAR mode, and calculation costs are low.

With reference to the following description and drawings, specific embodiments of the examples of the present application are disclosed in detail, and the means by which the principles of the examples of the present application can be employed are illustrated. It should be understood that the embodiments of the present application are therefore not limited in scope. Within the scope of the spirit and clauses of the appended claims, the embodiments of the present application include many changes, modifications, and equivalents.

BRIEF DESCRIPTION OF THE DRAWINGS

The included drawings are used to provide further understanding of the examples of the present application, which constitute a part of the description and are used to illustrate the embodiments of the present application and explain the principles of the present application together with textual description. Evidently, the drawings in the following description are merely some examples of the present application, and a person of ordinary skill in the art may obtain other embodiments according to the drawings without involving inventive skill. In the drawings:

FIG. 4 is a schematic diagram of a magnetic resonance scanning and imaging method according to examples of the present application;

FIG. 5 is a schematic diagram of the scanning time for an original scan sequence and the scanning time for an adjusted scan sequence according to examples of the present application;

FIG. 6 is a schematic diagram of a first radio-frequency pulse and a first gradient pulse according to examples of the present application;

FIG. 7 is a schematic diagram of an adjusted first radio-frequency pulse and an adjusted first gradient pulse according to examples of the present application;

DETAILED DESCRIPTION

The foregoing and other features of the examples of the present application will become apparent from the following description and with reference to the drawings. In the description and drawings, specific embodiments of the present application are disclosed in detail, and part of the embodiments in which the principles of the examples of the present application may be employed are indicated. It should be understood that the present application is not limited to the described embodiments. On the contrary, the examples of the present application include all modifications, variations, and equivalents which fall within the scope of the appended claims.

In the examples of the present application, the terms "first" and "second" and so on are used to distinguish different elements from one another by their title, but do not represent the spatial arrangement, temporal order, or the like of the elements, and the elements should not be limited by said terms. The term "and/or" includes any one of and all combinations of one or more associated listed terms. The terms "comprise", "include", "have", etc., refer to the presence of stated features, elements, components, or assemblies, but do not exclude the presence or addition of one or more other features, elements, components, or assemblies.

In the examples of the present application, the singular forms "a" and "the" or the like include plural forms, and should be broadly construed as "a type of" or "a kind of" rather than being limited to the meaning of "one". Furthermore, the term "the" should be construed as including both the singular and plural forms, unless otherwise specified in the context. In addition, the term "according to" should be construed as "at least in part according to . . . ", and the term "based on" should be construed as "at least in part based on . . . ", unless otherwise clearly specified in the context.

The features described and/or illustrated for one embodiment may be used in one or more other embodiments in an identical or similar manner, combined with features in other embodiments, or replace features in other embodiments. The term "include/comprise" when used herein refers to the presence of features, integrated components, steps, or assemblies, but does not exclude the presence or addition of one or more other features, integrated components, steps, or assemblies.

Figure 10:
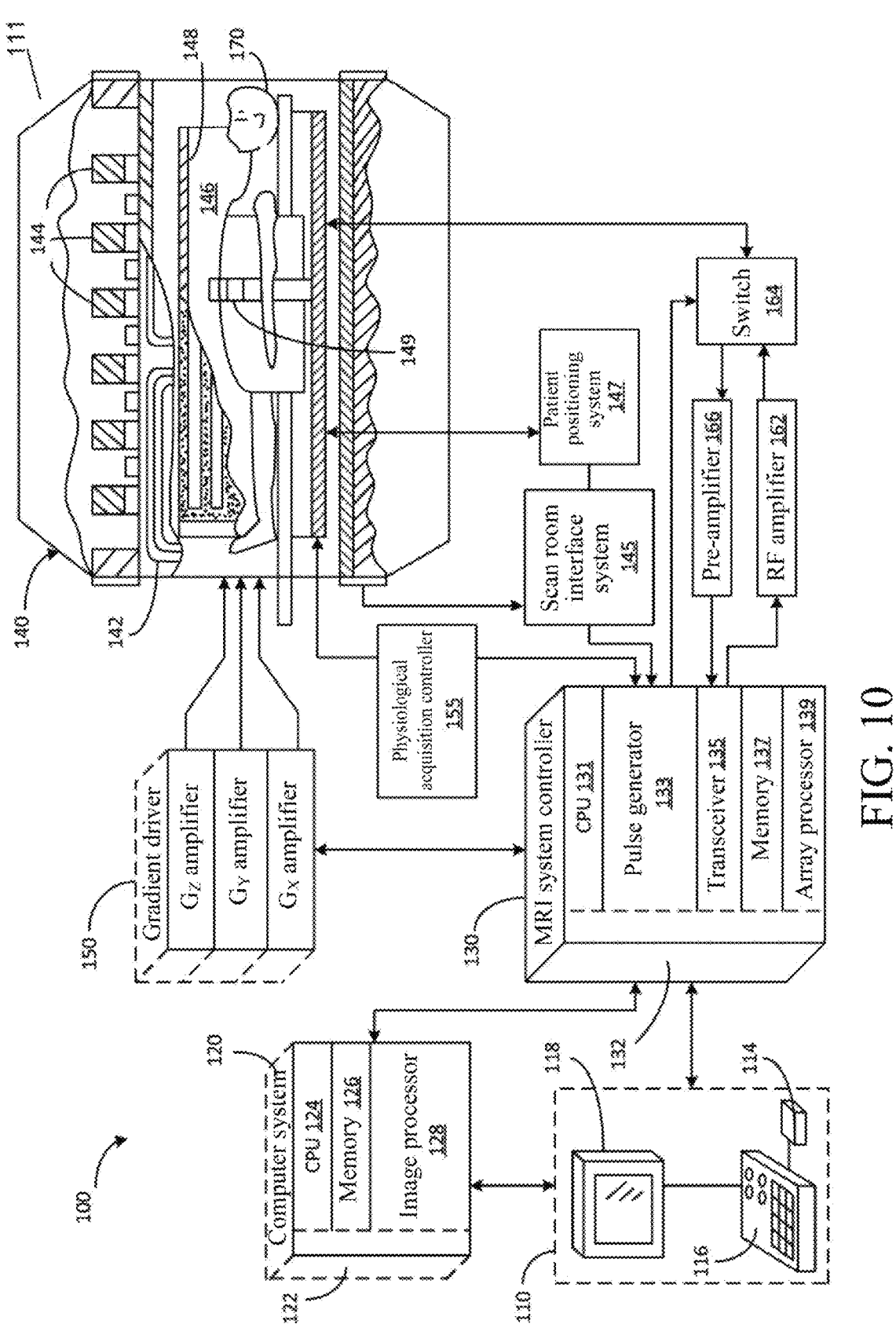
FIG. 10 is a schematic diagram of a magnetic resonance imaging system according to examples of the present application.

For case of understanding, FIG. 10 shows a magnetic resonance imaging (MRI) system 100 according to some examples of the present invention.

The MRI system 100 includes a scanning unit 111. The scanning unit 111 is used to perform a magnetic resonance scan on a subject (for example, a human body) 170 to generate image data of a region of interest of the subject 170. The region of interest may be a predetermined anatomical site or anatomical tissue.

Operation of the MRI system 100 is controlled by an operator workstation 110, and the operator workstation 110 includes an input device 114, a control panel 116, and a display 118. The input device 114 may be a joystick, a keyboard, a mouse, a trackball, a touch-activated screen, voice control, or any similar or equivalent input device. The control panel 116 may include a keyboard, a touch-activated screen, voice control, a button, a slider, or any similar or equivalent control device. The operator workstation 110 is coupled to and communicates with a computer system 120, and the computer system enables an operator to control the generation and viewing of an image on the display 118. The computer system 120 includes a plurality of components that communicate with one another by means of an electrical and/or data connection module 122. The connection module 122 may employ a direct wired connection, a fiber optic connection, a wireless communication link, etc. The computer system 120 may include a central processing unit (CPU) 124, a memory 126, and an image processor 128. In some embodiments, the image processor 128 may be replaced with an image processing function implemented in the CPU 124. The computer system 120 may be connected to an archival media device, a persistent or backup memory, or a network. The computer system 120 may be coupled to and communicate with a separate MRI system controller 130.

The MRI system controller 130 includes a set of components that communicate with one another by means of an electrical and/or data connection module 132. The connection module 132 may employ a direct wired connection, a fiber optic connection, a wireless communication link, etc. The MRI system controller 130 may include a CPU 131, a sequential pulse generator 133 that communicates with the operator workstation 110, a transceiver (or an RF transceiver) 135, a memory 137, and an array processor 139. In some embodiments, the sequential pulse generator 133 may be integrated into a resonance assembly 140 of the scanning unit 111 of the MRI system 100. The MRI system controller 130 may receive a command from the operator workstation 110, and is coupled to the scanning unit 111, to indicate an MRI scan sequence that is to be performed during an MRI scan, so as to control the scanning unit 111 to execute the described magnetic resonance scan procedure. The MRI system controller 130 is further coupled to and communicates with a gradient driver system 150, and the gradient driver system is coupled to a gradient coil assembly 142 to generate a magnetic field gradient during the MRI scan.

The sequential pulse generator 133 may further receive data from a physiological acquisition controller 155, the physiological acquisition controller receives signals from a plurality of different sensors (for example, electrocardiogram (ECG) signals from electrodes attached to a patient), the sensors being connected to the subject or patient 170 undergoing the MRI scan. The sequential pulse generator 133 is coupled to and communicates with a scan room interface system 145, and the scan room interface system receives signals from various sensors associated with the state of the resonance assembly 140. The scan room interface system 145 is further coupled to and communicates with a patient positioning system 147, and the patient positioning system sends and receives signals to control the movement of a patient table to a desired position to perform the MRI scan.

The MRI system controller 130 provides a gradient wave-form for the gradient driver system 150, the gradient driver system including Gx (x direction), Gy (y direction), and Gz (z direction) amplifiers, etc. Each of the Gx, Gy, and Gz gradient amplifiers excites a corresponding gradient coil in the gradient coil assembly 142, to generate a magnetic field gradient used to spatially encode an MR signal during the MRI scan. The gradient coil assembly 142 is disposed within the resonance assembly 140, the resonance assembly further includes a superconducting magnet having a superconduct-ing coil 144, and, during operation, the superconducting coil provides a static uniform longitudinal magnetic field B0 that runs through a cylindrical imaging volume 146. The reso-nance assembly 140 further includes an RF body coil 148; during operation, the RF body coil provides a transverse magnetic field B1, the transverse magnetic field B1 being approximately perpendicular to B0 that runs through the cylindrical imaging volume 146. The resonance assembly 140 may further include an RF surface coil 149, and the RF surface coil is used to image different anatomical structures of the patient undergoing the MRI scan. The RF body coil 148 and the RF surface coil 149 may be configured to operate in a transmit and receive mode, a transmit mode, or a receive mode.

The x direction may also be referred to as a frequency encoding direction or a $k_x$ direction in k-space. The y direction may be referred to as a phase encoding direction or a $k_y$ direction in the k-space. Gx may be used for frequency encoding or signal readout, and is usually referred to as a frequency encoding gradient or a readout gradient. Gy may be used for phase encoding, and is usually referred to as a phase encoding gradient. Gz may be used for slice (layer) position selection to obtain k-space data. It should be noted that a layer selection direction, a phase encoding direction, and a frequency encoding direction may be modified accord-ing to actual requirements.

The subject or patient 170 of the MRI scan may be positioned within the cylindrical imaging volume 146 of the resonance assembly 140. The transceiver 135 in the MRI system controller 130 generates RF excitation pulses that are amplified by an RF amplifier 162 and provided to the RF body coil 148 by means of a transmit/receive switch (T/R switch) 164.

As described above, the RF body coil 148 and the RF surface coil 149 may be used to transmit an RF excitation pulse and/or receive obtained MR signals from the patient undergoing the MRI scan. MR signals emitted by excited nuclei in the patient of the MRI scan may be sensed and received by the RF body coil 148 or the RF surface coil 149 and sent back to a pre-amplifier 166 by means of the T/R switch 164. The T/R switch 164 may be controlled by a signal from the sequential pulse generator 133 to electrically connect, when in the transmit mode, the RF amplifier 162 to the RF body coil 148, and to connect, when in the receive mode, the pre-amplifier 166 to the RF body coil 148. The T/R switch 164 may further enable the RF surface coil 149 to be used in the transmit mode or the receive mode.

In some embodiments, the MR signals sensed and received by the RF body coil 148 or the RF surface coil 149 and amplified by the pre-amplifier 166 are stored as a raw k-space data array in the memory 137 for post-processing. A reconstructed magnetic resonance image may be obtained by transforming/processing the stored raw k-space data.

In some embodiments, the MR signals sensed and received by the RF body coil 148 or the RF surface coil 149 and amplified by the pre-amplifier 166 are demodulated, filtered and digitized in a receiving portion of the transceiver

135, and transmitted to the memory 137 in the MRI system controller 130. For each image that is to be reconstructed, the data is rearranged into a separate k-space data array, each of the separate k-space data arrays is inputted into the array processor 139, and the array processor is operated to trans-form the data into an array of image data by means of a Fourier transform.

The array processor 139 uses a transform method, most commonly a Fourier transform, to create images from the received MR signals. These images are transmitted to the computer system 120 and stored in the memory 126. In response to commands received from the operator worksta-tion 110, the image data may be stored in a long-term memory, or may be further processed by the image processor 128 and transmitted to the operator workstation 110 for presentation on the display 118.

In various embodiments, components of the computer system 120 and the MRI system controller 130 may be implemented on the same computer system or on a plurality of computer systems. It should be understood that the MRI system 100 shown in FIG. 10 is intended for illustration. Suitable MRI systems may include more, fewer, and/or different components.

The MRI system controller 130 and the image processor 128 may separately or collectively include a computer processor and a storage medium. The storage medium records a predetermined data processing program that is to be executed by the computer processor. For example, the storage medium may store a program used to implement scanning (for example, a scan procedure and an imaging sequence), image reconstruction, image processing, etc. For example, the storage medium may store a program used to implement the magnetic resonance imaging method accord-ing to the examples of the present invention. The above storage medium may include, for example, a ROM, a floppy disk, a hard disk, an optical disk, a magneto-optical disk, a CD-ROM, or a non-volatile memory card.

The aforementioned "imaging sequence" (also referred to below as a scan sequence or a pulse sequence) is a combi-nation of pulses that have specific amplitudes, widths, directions, and time sequences and that are applied when a magnetic resonance imaging scan is performed. These pulses typically may include, for example, a radio-frequency pulse and a gradient pulse. The radio-frequency pulses may include, for example, radio-frequency excitation pulses, radio-frequency refocusing pulses, inverse recovery pulses, etc. The gradient pulses may include, for example, the aforementioned gradient pulse used for layer selection, gradient pulse used for phase encoding, gradient pulse used for frequency encoding, gradient pulse used for phase shift-ing (phase shift), gradient pulse used for dispersion of phases (dephasing), etc.

Typically, a plurality of scan sequences can be preset in the magnetic resonance system, so that the sequence suitable for clinical detection requirements can be selected. The clinical detection requirements may include, for example, an imaging site, an imaging function, an imaging effect, and the like.

Before scanning, a scan parameter needs to be set, includ-ing setting a SAR value. Currently, in scenarios in which the scan subject is an infant or a pregnant woman, or the scan subject has a particular disease (a cardiac patient, a febrile patient, or a patient that suffers from impaired secretory function), or an implant (an artificial limb, a pacemaker, a stent, etc.) is worn in the scan subject or on the body surface of the scan subject, a magnetic resonance scan needs to be performed in a low SAR mode, and therefore, a relatively low SAR value needs to be set during parameter setting.

Figures 1, 2:
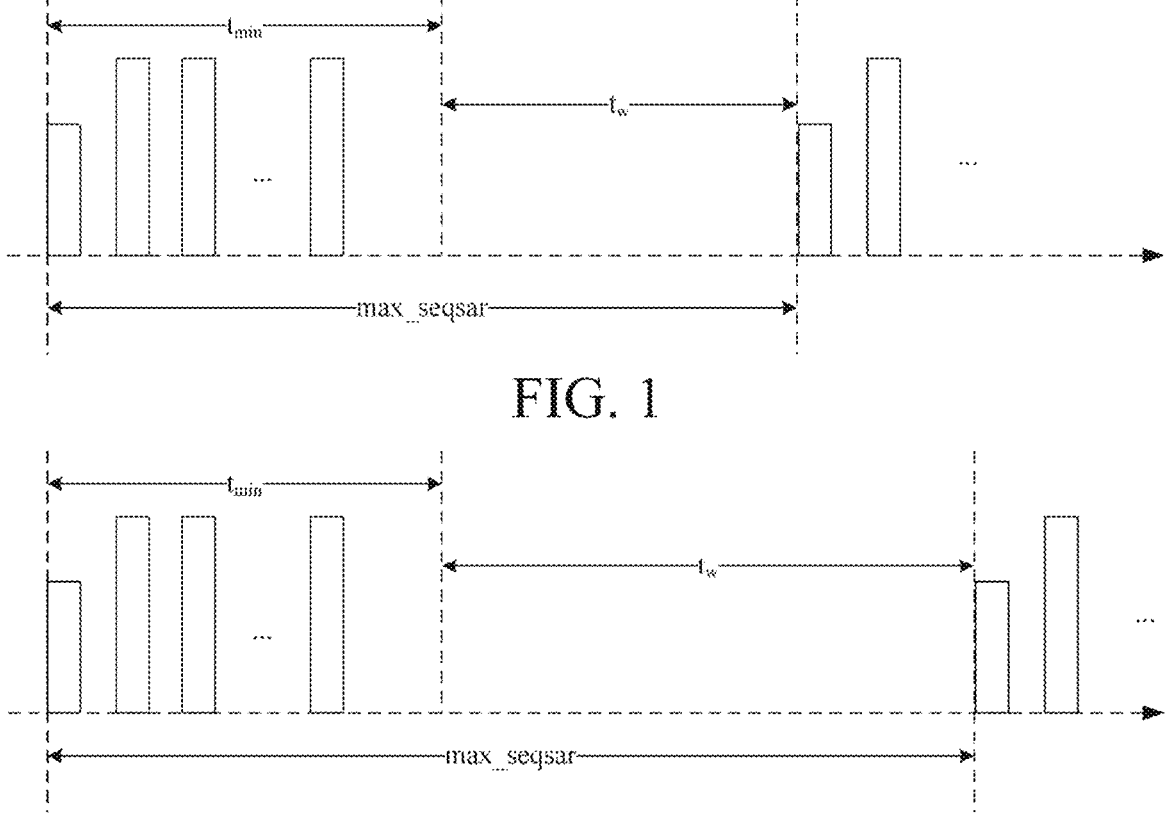
FIG. 1 is a schematic diagram of the scanning time in a normal SAR mode.
FIG. 2 is a schematic diagram of the scanning time in a low SAR mode.
Figure 3:
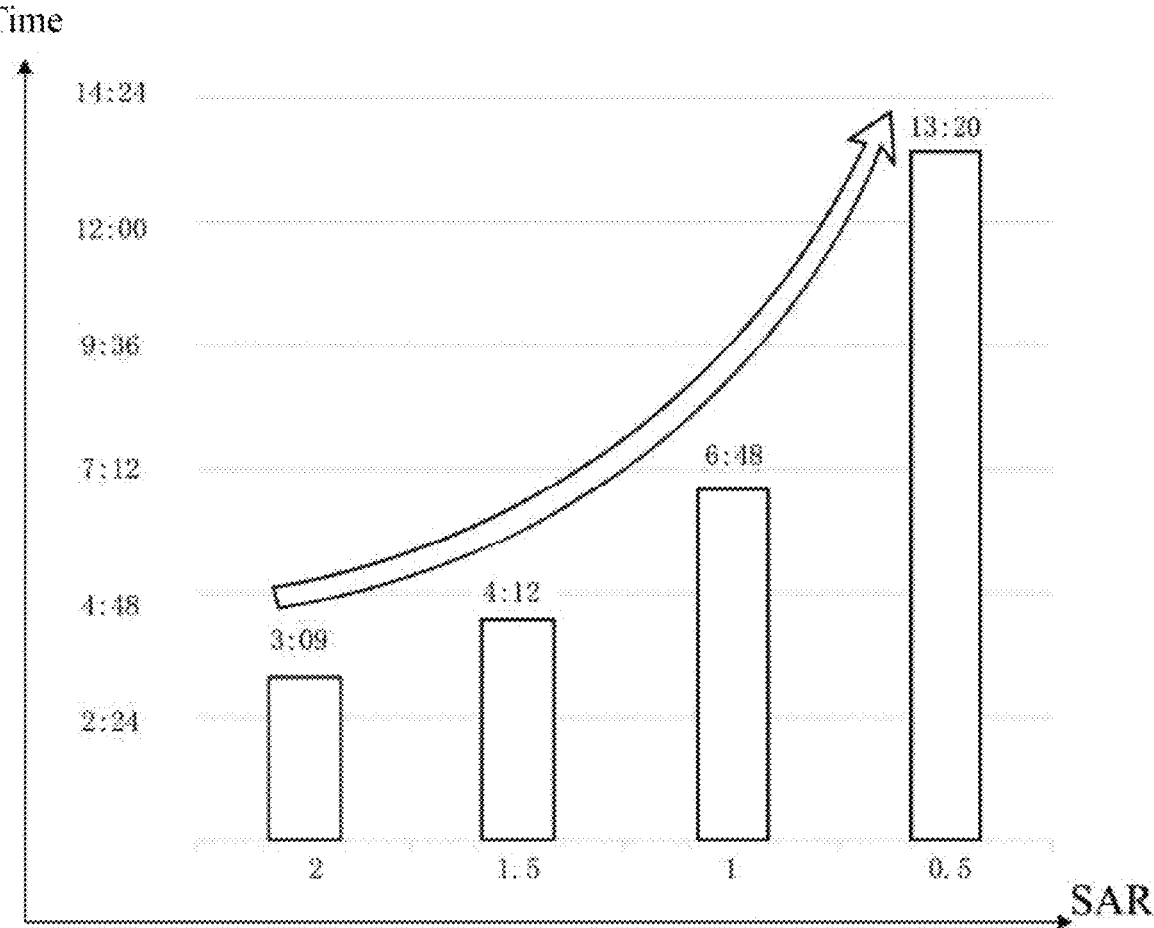
FIG. 3 is a schematic diagram of the relationship between scanning time and a SAR value.

FIG. 1 is a schematic diagram of the scanning time in a normal SAR mode (for example, SAR=3). FIG. 2 is a schematic diagram of the scanning time in a low SAR mode (for example, SAR=0.5). The same scan sequence is used in FIG. 1 and FIG. 2. As shown in FIG. 1 and FIG. 2, $t_{min}$ indicates the minimum time required to transmit the scan sequence, or rather the minimum scanning time required for the scan sequence without considering the limitations of the SAR value. After the scan sequence is transmitted, a large part thereof is absorbed by a scan subject and converted into thermal energy, the SAR value rises, and waiting time $t_w$ indicates the time required to wait for the thermal energy to be dissipated, such that the SAR value returns to below the set value; max_seqsar is equal to the sum of $t_w$ and $t_{min}$, and indicates the minimum scanning time required for the scan sequence without considering the limitations of the SAR value. Therefore, as shown in FIG. 1 and FIG. 2, if the SAR value is set to a relatively low value, the waiting time is relatively long. FIG. 3 is a schematic diagram of the relationship between scanning time and SAR value. As shown in FIG. 3, for the same scan sequence, the scanning time increases dramatically as the SAR value decreases. In other words, because there is a limitation of a very low SAR value in the low SAR mode, scanning time increases dramatically.

In view of at least one of the above problems, the examples of the present application provide a magnetic resonance scanning and imaging method and a magnetic resonance imaging system.

Description is made below in conjunction with the examples.

The examples of the present application provide a magnetic resonance scanning and imaging method. FIG. 4 is a schematic diagram of a magnetic resonance scanning and imaging method according to the examples of the present application. As shown in FIG. 4, the method includes: at step 401: determining a pulse to be adjusted in a scan sequence, the pulse to be adjusted including a first radio-frequency pulse and a first gradient pulse applied along with the first radio-frequency pulse. The method further includes determining an adjustment factor based on the first gradient pulse and a minimum repetition time related to a specific absorption rate of radio-frequency energy at step 402. The method also includes at step 403: adjusting the scan sequence based on the adjustment factor; and at step 404: using the adjusted scan sequence, performing a diagnostic scan on a site to be examined, to obtain a magnetic resonance image.

In some examples, the scan sequence includes at least a radio-frequency pulse and a gradient pulse applied along with the radio-frequency pulse. The radio-frequency pulse may include at least one among an excitation pulse and a refocusing pulse, and optionally, may further include pre-pulses such as an inversion recovery pulse and a fat suppression pulse. The gradient pulse may include at least one among a gradient pulse for layer selection, a gradient pulse for frequency encoding, and a gradient pulse for phase encoding. Optionally, the scan sequence may further include a gradient pulse not applied along with the radio-frequency pulse. The examples of the present application are not limited thereto. For example, the scan sequence may include a gradient echo (GRE) pulse sequence, a fast spin echo (FSE) pulse sequence, etc. Examples are not listed one by one herein.

In some examples, in 401, the pulse to be adjusted in the scan sequence is determined. The pulse to be adjusted includes the first radio-frequency pulse and the first gradient pulse applied along with the first radio-frequency pulse, and the first radio-frequency pulse includes at least one among an excitation pulse and a refocusing pulse. In other words, the first radio-frequency pulse to be adjusted may be selected from radio-frequency pulses in the scan sequence. If the radio-frequency pulses in the scan sequence each are at least one among an excitation pulse or a refocusing pulse, and the radio-frequency pulses in the scan sequence each are applied along with a gradient pulse, then the radio-frequency pulses in the scan sequence each may be used as the first radio-frequency pulse. In other words, if a radio-frequency pulse in the scan sequence is an inversion recovery pulse or a fat suppression pulse, or if a radio-frequency pulse is not applied along with a gradient pulse, then the radio-frequency pulse cannot be used as the first radio-frequency pulse. Therefore, a radio-frequency pulse that is applied along with a gradient pulse and that is an excitation pulse or a refocusing pulse in the scan sequence is used as the first radio-frequency pulse. In addition, the first gradient pulse to be adjusted is a gradient pulse applied along with the first radio-frequency pulse, and may include at least one among a gradient pulse for layer selection, a gradient pulse for frequency encoding, and a gradient pulse for phase encoding.

The above are merely illustrative descriptions. The examples of the present application are not limited thereto. For example, when the radio-frequency pulses in the scan sequence are excitation pulses and are applied along with a gradient pulse, only some radio-frequency pulses may be selected as the first radio-frequency pulse. Examples are not listed one by one herein.

In some examples, the scan sequence further includes a second gradient pulse not applied along with the first radio-frequency pulse. The not being along with the first radio-frequency pulse may be a gradient pulse not applied along with any radio-frequency pulses in the scan sequence (scenario 1), or may be a gradient pulse applied along with an inversion recovery pulse or a fat suppression pulse in the scan sequence (scenario 2). In the following examples, illustrative descriptions are made by using scenario 1 of the second gradient pulse as an example. In addition, when a plurality of gradient pulses meet a condition in scenario 1 and scenario 2, any gradient pulse may be selected from the plurality of gradient pulses as the second gradient pulse. The examples of the present application are not limited thereto.

In some examples, after the pulse to be adjusted is selected in 401, a waveform and a time sequence of the scan sequence may be generated based on a set scan parameter (for example, layer thickness, scan matrix size, or sampling bandwidth) and the type of the scan sequence.

In examples of the present application, the adjustment factor is determined based on the first gradient pulse and the minimum repetition time related to the specific absorption rate (SAR) of radio-frequency energy, or the adjustment factor is determined based on the first gradient pulse, the second gradient pulse, and the minimum repetition time related to the specific absorption rate of radio-frequency energy, the scan sequence is adjusted based on the adjustment factor determined in the above manner, and a scan is performed by using the adjusted scan sequence. Therefore, scanning time and repetition time TR can be minimized in a low SAR mode. The principle thereof is first described below.

As shown in FIG. 1 and FIG. 2, in the low SAR mode, the scanning time increases dramatically due to an increase in waiting time. If the waiting time is reduced, then the scanning time can be reduced. However, in this way, the limitation of the SAR value may be unable to be satisfied. Therefore, in the low SAR mode, it may be considered to adjust the scan sequence, for example, to decrease the amplitude value of the first radio-frequency pulse and the amplitude value of the first gradient pulse in the scan sequence, and increase the width of the first radio-frequency pulse and the width of the first gradient pulse, so that the transmission time of the scan sequence is prolonged and the amplitude value is decreased. Thus, the SAR value is decreased without requiring a relatively long waiting time, and the limitation of the SAR value is satisfied. As for how to decrease the amplitude value and increase the width, the inventor has found that when the waiting time is 0, that is, max_seqsar is equal to $t_{min}$, the scanning time and the repetition time TR may be minimized. FIG. 5 is a schematic diagram of the scanning time for an original scan sequence and the scanning time for an adjusted scan sequence according to examples of the present application. As shown in FIG. 5, for the same SAR value, the amplitude value is decreased and the width is increased, so that max_seqsar' when using the adjusted scan sequence is equal to $t_{min}$', and the time of $t_{reduction}$ can be reduced in comparison with max_seqsar when using the original scan sequence. Therefore, scanning time and repetition time TR can be minimized when the minimum time required to transmit the scan sequence is equal to the minimum scanning time required for the scan sequence when the limitation of the SAR value is considered. In other words, an adjustment factor that enables max_seqsar to be equal to $t_{min}$ is calculated, the scan sequence is adjusted based on the adjustment factor, and a scan is performed using the adjusted scan sequence, so that the scanning time and the repetition time TR can be minimized in the low SAR mode.

The principle of how to calculate the adjustment factor is described below.

FIG. 6 is a schematic diagram of a first radio-frequency pulse and a first gradient pulse according to examples of the present application. FIG. 7 is a schematic diagram of a first radio-frequency pulse and a first gradient pulse that are obtained after adjustment is performed based on an adjustment factor according to examples of the present application. In FIG. 6 and FIG. 7, for the limitation of the same SAR value, the adjustment factor is greater than 0 and less than 1. The first radio-frequency pulse may be a sine wave. However, the examples of the present application are not limited thereto. The pulse width of the first radio-frequency pulse is $t_L$, the maximum gradient strength value of the first gradient pulse is $G_{max}$, a gradient rise time represents the time required when a gradient field reaches the maximum gradient strength value from 0, a gradient fall time represents the time required when the gradient field decreases from the maximum gradient strength value to 0, and the gradient rise time is equal to the gradient fall time. For convenience of description below, $t_{slop}$ represents the sum of the gradient rise time and the gradient fall time, or $t_{slop}$ is equal to twice the gradient rise time. A gradient slew rate is an index describing the rate at which gradient length changes, and represents the amount of change in gradient field strength in a unit time. The calculation formula of the gradient slew rate is: gradient slew rate=maximum gradient strength value÷rise time. The duration of maximum gradient strength is the length $t_{plat}$ of an upper base of a trapezium. As shown in FIG. 6, for a first radio-frequency pulse 61, the amplitude value at each location of the first radio-frequency pulse is multiplied by the adjustment factor, and the pulse width of the first radio-frequency pulse is divided by the adjustment factor, to obtain the adjusted first radio-frequency pulse 71 as shown in FIG. 7. In other words, the pulse width $t_L$' of the adjusted first radio-frequency pulse is increased, and the amplitude value is decreased, but the area of a figure enclosed by a waveform of the first radio-frequency pulse and a time axis remains unchanged before and after the adjustment. As shown in FIG. 6, for a first gradient pulse 62, the duration $t_{plat}$ of maximum gradient strength of the first gradient pulse is divided by the adjustment factor, the maximum gradient strength value $G_{max}$ of the first gradient pulse and the rise time (or fall time or $t_{slop}$) of the first gradient pulse are multiplied by the adjustment factor, and the gradient slew rate remains unchanged, to obtain the adjusted first gradient pulse 72 as shown in FIG. 7.

Figure 8:
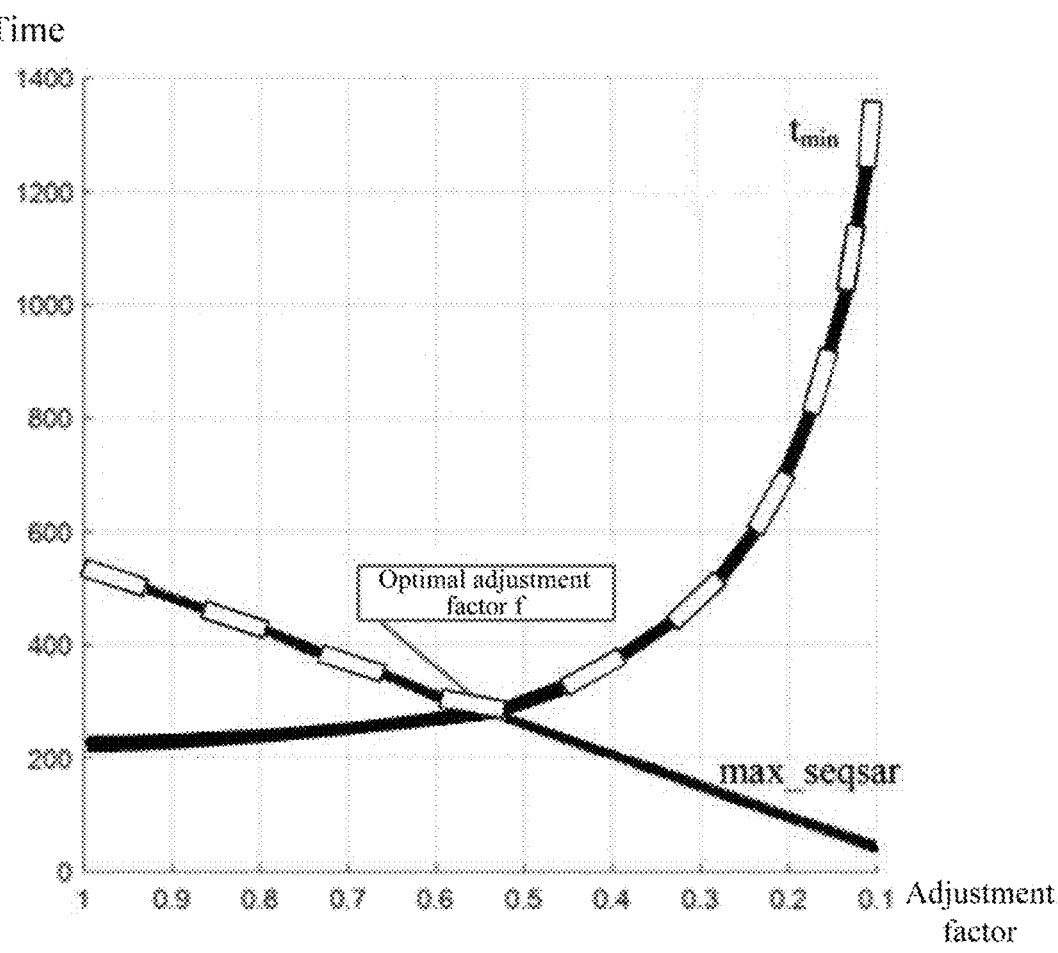
FIG. 8 is a schematic diagram of the relationship between an adjustment factor and max_seqsar and $t_{min}$ according to examples of the present application.

FIG. 8 is a schematic diagram of the relationship between an adjustment factor and each of max_seqsar and $t_{min}$ according to examples of the present application. As shown in FIG. 8, the inventor found that, under the limitation of the same SAR value, max_seqsar approximately decreases linearly as the adjustment factor decreases, and $t_{min}$ approximately increases exponentially as the adjustment factor decreases. It can be learned from the aforementioned analysis that the scanning time and the repetition time TR can be minimized by using an adjustment factor that enables max_seqsar to be equal to $t_{min}$. In other words, an adjustment factor corresponding to an intersection of two lines in FIG. 8 is an optimal adjustment factor, and can be used to minimize the scanning time and the repetition time TR. How to calculate the optimal adjustment factor $f$ is described below.

In some examples, when the scan sequence does not include the second gradient pulse, the adjustment factor is determined based on the first gradient pulse and the minimum repetition time related to the specific absorption rate of radio-frequency energy, and when the scan sequence includes the second gradient pulse, the adjustment factor is determined based on the first gradient pulse, the second gradient pulse, and the minimum repetition time related to the specific absorption rate of radio-frequency energy. Explanations are provided below, respectively.

(I) The scan sequence includes the second gradient pulse.

In some examples, the adjustment factor (the optimal adjustment factor $f$) is determined based on the rise time (for example, $t_{slop}$) of the first gradient pulse, the duration $t_{plat}$ of the maximum gradient strength of the first gradient pulse, the time difference $t_{untouched}$ between the end time of the second gradient pulse and the end time of the first gradient pulse, and the minimum repetition time $TR_{min}$. The adjustment factor (the optimal adjustment factor $f$) causes: the product of the minimum repetition time and the adjustment factor to be equal to the sum of the time difference, a first time and a second time, the first time being equal to twice the product of the rise time and the adjustment factor, and the second time being equal to the ratio of the duration to the adjustment factor.

As shown in FIG. 6 and FIG. 7, the scan sequence may further include the aforementioned second gradient pulse 60. During calculation of the adjustment factor, the second gradient pulse needs to be considered, but the second gradient pulse does not need to be adjusted based on the adjustment factor. The time difference between the end time of the second gradient pulse and the end time of the first gradient pulse is denoted as $t_{untouched}$. max_seqsar may be determined based on the minimum repetition time $TR_{min}$ related to the specific absorption rate (for example, a SAR value set in the low SAR mode) of radio-frequency energy, $$[TR]_{min} = \frac{JSTD \times \#stdrf}{mass \times SAR},$$ (Formula (1))

where JSTD represents the amount of thermal energy generated per single standard pulse in Joules (which is a known quantity), #stdrf represents the quantity of standard pulses in the scan sequence, mass represents the mass of a detected subject, and SAR represents a set SAR value, for example, the SAR value set in the low SAR mode.

Before the scan sequence is adjusted, $t_{min}=t_{plat}+t_{slop}+t_{untouched}$, and max_seqsar=$TR_{min}=t_{min}+t_w$. As shown in FIG. 7, after the scan sequence is adjusted based on the adjustment factor $f$, max_seqsar'=max_seqsar$\times f$ after the scan sequence is adjusted (because max_seqsar has a linear relationship with $f$, as shown in FIG. 8), $t_{min}'=t_{plat}'+t_{slop}'+t_{untouched}=t_{plat}/f+t_{slop}\times f+t_{untouched}$ after the scan sequence is adjusted, the first time is $t_{slop}'$, the second time is $t_{plat}'$, and the adjustment factor (the optimal adjustment factor $f$) causes: after the scan sequence is adjusted, the waiting time $t_w$ to be 0, and max_seqsar'=$t_{min}'$. In other words, the product of the minimum repetition time and the adjustment factor is equal to the sum of the time difference, the first time, and the second time: $TR_{min}\times f=t_{plat}'+t_{slop}'+t_{untouched}=t_{plat}/f+t_{slop}\times f+t_{untouched}$. In the above formula, only $f$ is an unknown quantity. Therefore, $$f = \frac{-t_{untouched} \pm \sqrt{t_{untouched}^2 - 4(t_{slop} - [TR]_{min})t_{flat}}}{2(t_{slop} - [TR]_{min})}.$$ (Formula (2))

In some examples, after the waveform and the time sequence of the scan sequence are generated, values of $t_{untouched}$, $t_{slop}$, and $t_{flat}$ may be determined based on the waveform and the time sequence of the scan sequence, the second gradient pulse and the selected first gradient pulse, and the quantity of standard pulses in the scan sequence and the mass of the detected subject and the SAR value in set parameters are determined and are substituted into Formula (1), to calculate $TR_{min}$. The values $t_{untouched}$, $t_{slop}$, $t_{flat}$, and $TR_{min}$ are substituted into Formula (2), to calculate a value of the adjustment factor $f$. In addition, the adjustment factor needs to be greater than 0 and less than 1

(II) The scan sequence does not include the second gradient pulse.

In some examples, the adjustment factor (the optimal adjustment factor $f$) is determined based on the rise time of the first gradient pulse, the duration of the maximum gradient strength of the first gradient pulse and the minimum repetition time. The adjustment factor (the optimal adjustment factor $f$) causes: the product of the minimum repetition time and the adjustment factor to be equal to an adjustment factor for the sum of a first time and a second time, the first time being equal to twice the product of the rise time and the adjustment factor, and the second time being equal to the ratio of the duration to the adjustment factor.

Different from (I), because the second gradient pulse is not included, $t_{untouched}$ is 0. Therefore, $t_{untouched}$ in Formula (1) is set to 0, to obtain $$f = \frac{\pm \sqrt{-4(t_{slop} - [TR]_{min})t_{flat}}}{2(t_{slop} - [TR]_{min})}.$$ (Formula (3))

After the waveform and the time sequence of the scan sequence are generated, values of $t_{slop}$ and $t_{flat}$ may be determined based on the waveform and the time sequence of the scan sequence and the selected first gradient pulse, and the quantity of standard pulses in the scan sequence and the mass of the detected subject and the SAR value in set parameters are determined and are substituted into Formula (1), to calculate $TR_{min}$. The values $t_{slop}$, $t_{flat}$, and $TR_{min}$ are substituted into Formula (3), to calculate the value of the adjustment factor $f$. In addition, the adjustment factor needs to be greater than 0 and less than 1.

In some examples, there is also a correlation between the value of the adjustment factor and image quality. A larger adjustment factor (for example, closer to 1) indicates better image quality, a clearer image, and higher contrast, and a smaller adjustment factor (for example, closer to 0) indicates poorer image quality, a more blurred image, and lower contrast. In other words, if the calculated adjustment factor is excessively small, the quality of the magnetic resonance image may be poor. Therefore, the method may further include: replacing the value of the adjustment factor with the value of a preset factor when the adjustment factor is less than or equal to the preset factor. In other words, when the adjustment factor is less than or equal to the value of the preset factor, the scan sequence is adjusted using the preset factor. Therefore, image quality can be ensured while scanning time is reduced in the low SAR mode. The preset factor may be pre-defined to be invariable or may be set by an operator to be adjustable, and the value of the preset factor is related to an image quality requirement. For example, the preset factor may be set to 0.5, etc. The present application is not limited thereto.

In some examples, after the adjustment factor is determined, in 403, the adjusting the scan sequence based on the adjustment factor includes: adjusting the selected first radio-frequency pulse and the selected first gradient pulse in the scan sequence based on the adjustment factor. Another pulse (if any) in the scan sequence does not need to be adjusted. The amplitude value of the first radio-frequency pulse in the scan sequence, the maximum gradient strength value of the first gradient pulse and the rise time of the first gradient pulse are separately multiplied by the adjustment factor. The pulse width of the first radio-frequency pulse and the duration of maximum gradient strength of the first gradient pulse are divided by the adjustment factor, to obtain the adjusted scan sequence.

In some examples, for the first radio-frequency pulse, the amplitude value at each location of the first radio-frequency pulse is multiplied by the adjustment factor, and the pulse width of the first radio-frequency pulse is divided by the adjustment factor. The pulse width of the adjusted first radio-frequency pulse is increased, and the amplitude value is decreased, but the area of a figure enclosed by a waveform of the first radio-frequency pulse and a time axis remains unchanged before and after the adjustment. For the first gradient pulse, duration $t_{plat}$ of maximum gradient strength of the first gradient pulse is divided by the adjustment factor, the maximum gradient strength value of the first gradient pulse and the rise time (and fall time) of the first gradient pulse are multiplied by the adjustment factor, to keep the gradient slew rate unchanged. After the first radio-frequency pulse and the first gradient pulse are adjusted, time sequences of some other pulses (if any) in the scan sequence may change correspondingly (for example, be delayed), and the waveform and the time sequence of the scan sequence may be regenerated.

In some examples, in 404, the diagnostic scan is performed on the site to be examined using the adjusted scan sequence, to obtain the magnetic resonance image. When the scan is performed on the site to be examined using the adjusted scan sequence, a minimum time $t_{min}$ required to transmit the adjusted scan sequence is equal to a minimum scanning time max_seqsar required for the adjusted scan sequence when the limitation of the SAR value is considered. In addition, for a magnetic resonance image obtaining method, reference may be made to the related art. The examples of the present application are not limited thereto.

In some examples, if switching to a next scan subject to be scanned, then the aforementioned scanning and imaging method is performed again.

Figure 9:
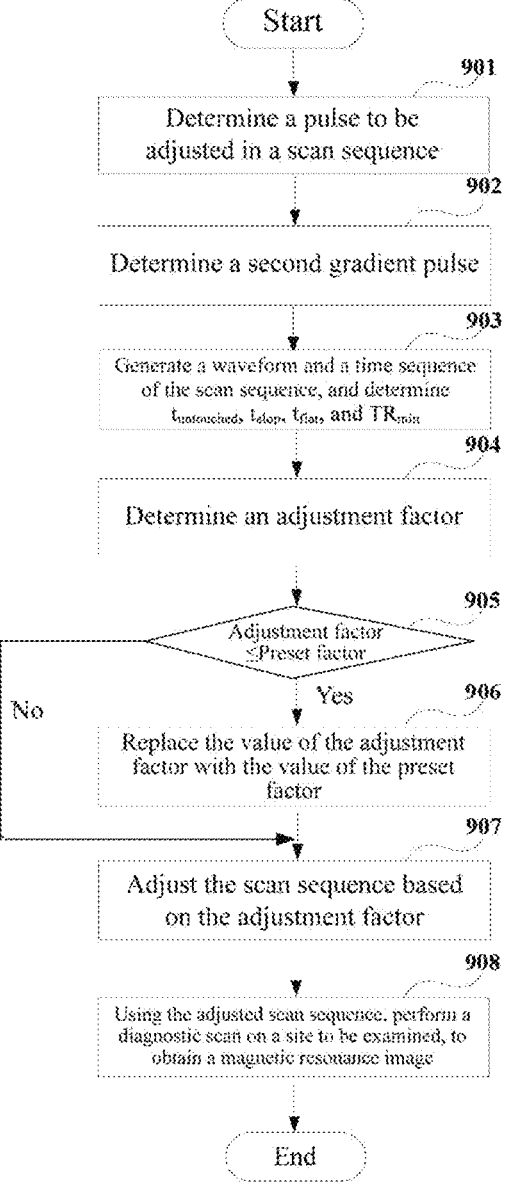
FIG. 9 is a schematic diagram of a magnetic resonance scanning and imaging method according to examples of the present application.

FIG. 9 is a schematic diagram of a magnetic resonance scanning and imaging method according to examples of the present application. As shown in FIG. 9, the method includes: at step 901: determining a pulse to be adjusted in a scan sequence, the pulse to be adjusted including a first radio-frequency pulse and a first gradient pulse applied along with the first radio-frequency pulse. At step 902 a second gradient pulse is determined and at step 903: a waveform and a time sequence of the scan sequence is generated, and $t_{untouched}$, $t_{slop}$, $t_{flat}$, and $TR_{min}$ are determined. At step 904, the method includes: determining an adjustment factor and at step 905, the method includes determining whether the adjustment factor is less than or equal to a preset factor. At step 906, the method includes performing when the determination result is "yes", or performing 907 otherwise.

Step 906 further includes replacing the value of the adjustment factor with the value of the preset factor. At step 907 the scan sequence is adjusted based on the adjustment factor. Further at step 908 the adjusted scan sequence is used and a diagnostic scan is performed on a site to be examined, to obtain a magnetic resonance image.

Specific embodiments of 901 to 908 are as described above, and are not be repeated herein.

In the above example, the adjustment factor is determined based on the first gradient pulse applied simultaneously with the first radio-frequency pulse and a minimum repetition time related to a specific absorption rate of radio-frequency energy, the scan sequence is adjusted based on the adjustment factor, and the diagnostic scan is performed on the site to be examined using the adjusted scan sequence. Therefore, scanning time can be minimized as much as possible in a low SAR mode, and calculation costs are low.

An example of the present application further provides a magnetic resonance imaging system. The configuration of the magnetic resonance imaging system is as shown in FIG. 10, and repeated parts are not described herein.

In some examples, different from the aforementioned magnetic resonance imaging system in FIG. 10, the controller 130 is configured to perform the aforementioned magnetic resonance scanning and imaging method, namely, is further configured to: determine a pulse to be adjusted in a scan sequence, the pulse to be adjusted including a first radio-frequency pulse and a first gradient pulse applied along with the first radio-frequency pulse; determine an adjustment factor based on the first gradient pulse and a minimum repetition time related to a specific absorption rate of radio-frequency energy; adjust the scan sequence based on the adjustment factor; and control the scanning unit to perform a diagnostic scan on a site to be examined using the adjusted scan sequence, to obtain a magnetic resonance image.

In some examples, the controller 130 (which may alternatively be a processor) includes a computer processor and a storage medium. The storage medium records a predetermined data processing program that is to be executed by the computer processor. For example, the storage medium may store a program configured to implement scanning (for example, including waveform design/conversion, etc.), image reconstruction, image processing, etc., for example, may store a program configured to implement an adjustment factor determination method according to the examples of the present invention. The adjustment factor determination method includes: determining a pulse to be adjusted in a scan sequence, the pulse to be adjusted including a first radio-frequency pulse and a first gradient pulse applied along with the first radio-frequency pulse; and determining an adjustment factor based on the first gradient pulse and a minimum repetition time related to a specific absorption rate of radio-frequency energy. Optionally, the scan sequence may be adjusted based on the adjustment factor. A specific embodiment thereof is as described above, and details are not described herein again. The above storage medium may include, for example, a ROM, a floppy disk, a hard disk, an optical disk, a magneto-optical disk, a CD-ROM, or a non-volatile memory card.

Figure 11:
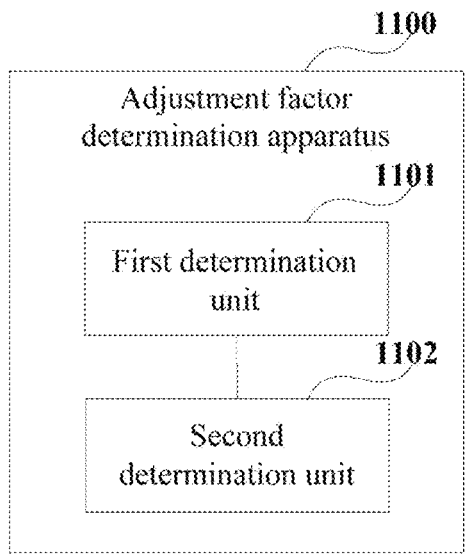
FIG. 11 is a schematic diagram of an adjustment factor determination apparatus according to examples of the present application.

The examples of the present application further provide an adjustment factor determination apparatus. FIG. 11 is a schematic diagram of an adjustment factor determination apparatus according to examples of the present application. As shown in FIG. 11, the apparatus 1100 includes:

A first determination unit 1101, which determines a pulse to be adjusted in a scan sequence, the pulse to be adjusted including a first radio-frequency pulse and a first gradient pulse applied along with the first radio-frequency pulse; and A first determination unit 1102, which determines an adjustment factor based on the first gradient pulse and a minimum repetition time related to a specific absorption rate of radio-frequency energy.

Embodiments of the first determination unit 1101 and the first determination unit 1102 are as described above, and are not repeated herein.

The examples of the present application further provide a computer-readable program. When the program is executed in an apparatus or an MRI system, the program causes a computer to execute, in the apparatus or the MRI system, the adjustment factor determination method according to the aforementioned examples.

The examples of the present application further provide a storage medium storing a computer-readable program. The computer-readable program enables a computer to perform, in an apparatus or an MRI system, the adjustment factor determination method according to the aforementioned examples.

The above apparatus and method of the present application can be implemented by hardware, or can be implemented by hardware in combination with software. The present application relates to the foregoing type of computer-readable program. When executed by a logic component, the program causes the logic component to implement the foregoing apparatus or a constituent component, or causes the logic component to implement various methods or steps as described above. The present application further relates to a storage medium for storing the above program, such as a hard disk, a magnetic disk, an optical disk, a DVD, a flash memory, etc.

The method/apparatus described with reference to the examples of the present application may be directly embodied as hardware, a software module executed by a processor, or a combination of the two. For example, one or more of the functional block diagrams and/or one or more combinations of the functional block diagrams as shown in the drawings may correspond to either software modules or hardware modules of a computer program flow. The foregoing software modules may respectively correspond to the steps shown in the figures. The foregoing hardware modules may be implemented, for example, by firming the foregoing software modules by using a field-programmable gate array (FPGA).

The software modules may be located in a RAM memory, a flash memory, a ROM memory, an EPROM memory, an EEPROM memory, a register, a hard disk, a removable disk, a CD-ROM, or any storage medium in other forms known in the art. The storage medium may be coupled to a processor, so that the processor can read information from the storage medium and can write information into the storage medium. Alternatively, the storage medium may be a constituent component of the processor. The processor and the storage medium may be located in an ASIC. The software module may be stored in a memory of a mobile terminal, and may also be stored in a memory card that can be inserted into a mobile terminal. For example, if a device (such as a mobile terminal) uses a large-capacity MEGA-SIM card or a large-capacity flash memory apparatus, then the software modules may be stored in the MEGA-SIM card or the large-capacity flash memory apparatus.

One or more of the functional blocks and/or one or more combinations of the functional blocks shown in the drawings may be implemented as a general-purpose processor, a digital signal processor (DSP), an application-specific integrated circuit (ASIC), a field-programmable gate array (FPGA) or other programmable logic devices, a discrete gate or transistor logic device, a discrete hardware assembly, or any appropriate combination thereof, which is used for implementing the functions described in the present application. The one or more functional blocks and/or the one or more combinations of the functional blocks shown in the drawings may also be implemented as a combination of computing equipment, such as a combination of a DSP and a microprocessor, a plurality of microprocessors, one or more microprocessors in communication combination with a DSP, or any other such configuration.

The present application is described above with reference to specific embodiments. However, it should be clear to those skilled in the art that the foregoing description is merely illustrative and is not intended to limit the scope of protection of the present application. Various variations and modifications may be made by those skilled in the art according to the principle of the present application, and said variations and modifications also fall within the scope of the present application.

The invention claimed is:

1. A magnetic resonance scanning and imaging method, characterized in that the method comprises:

determining a pulse to be adjusted in a scan sequence, the pulse to be adjusted comprising a first radio-frequency pulse and a first gradient pulse applied along with the first radio-frequency pulse;

determining an adjustment factor based on the first gradient pulse and a minimum repetition time related to a specific absorption rate of radio-frequency energy;

adjusting the scan sequence based on the adjustment factor; and using the adjusted scan sequence, performing a diagnostic scan on a site to be examined, to obtain a magnetic resonance image.

2. The method according to claim 1, characterized in that the first radio-frequency pulse comprises at least one among an excitation pulse and a refocusing pulse.

3. The method according to claim 1, characterized in that the scan sequence further comprises a second gradient pulse not applied along with the first radio-frequency pulse; and determining the adjustment factor based on the first gradient pulse, the second gradient pulse, and the minimum repetition time related to the specific absorption rate of radio-frequency energy.

4. The method according to claim 1, characterized in that determining an adjustment factor based on the first gradient pulse and a minimum repetition time related to a specific absorption rate of radio-frequency energy comprises:

determining the adjustment factor based on the rise time of the first gradient pulse, the duration of maximum gradient strength of the first gradient pulse, and the minimum repetition time.

5. The method according to claim 4, characterized in that the product of the minimum repetition time and the adjustment factor is equal to the sum of a first time and a second time, the first time being equal to twice the product of the rise time and the adjustment factor, and the second time being equal to the ratio of the duration to the adjustment factor.

6. The method according to claim 3, characterized in that determining the adjustment factor based on the first gradient pulse, the second gradient pulse, and the minimum repetition time related to the specific absorption rate of radio-frequency energy comprises:

determining the adjustment factor based on the rise time of the first gradient pulse, the duration of maximum gradient strength of the first gradient pulse, the time difference between the end time of the second gradient pulse and the end time of the first gradient pulse, and the minimum repetition time.

7. The method according to claim 6, characterized in that the product of the minimum repetition time and the adjustment factor is equal to the sum of the time difference, a first time, and a second time, the first time is equal to twice the product of the rise time and the adjustment factor, and the second time is equal to the ratio of the duration to the adjustment factor.

8. The method according to claim 1, characterized in that the method further comprises:

replacing the value of the adjustment factor with the value of a preset factor when the adjustment factor is less than or equal to the preset factor.

9. The method according to claim 1, characterized in that adjusting the scan sequence based on the adjustment factor comprises:

multiplying separately the amplitude value of the first radio-frequency pulse in the scan sequence, the maximum gradient strength value of the first gradient pulse, and the rise time of the first gradient pulse by the adjustment factor; and dividing the pulse width of the first radio-frequency pulse and the duration of maximum gradient strength of the first gradient pulse by the adjustment factor, to obtain an adjusted scan sequence.

10. The method according to claim 1, characterized in that the adjustment factor is greater than 0 and less than 1.

11. A magnetic resonance imaging system, characterized in that the system comprises:

a scanning unit; and a controller configured to execute the magnetic resonance scanning and imaging method according to claim 1.

* * * * *